(12) United States Patent
Moreaux

(10) Patent No.: US 6,545,527 B2
(45) Date of Patent: *Apr. 8, 2003

(54) CONFIGURABLE ELECTRONIC CIRCUIT

(75) Inventor: Christophe Moreaux, Eguilles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/085,845

(22) Filed: Feb. 26, 2002

(65) Prior Publication Data

US 2002/0079949 A1 Jun. 27, 2002

Related U.S. Application Data

(63) Continuation of application No. 09/468,261, filed on Dec. 20, 1999, now Pat. No. 6,377,111.

(30) Foreign Application Priority Data

Dec. 23, 1998 (FR) .............................................. 98 16367

(51) Int. Cl.[7] .......................... H03K 17/22; H01H 37/76
(52) U.S. Cl. .......................................... 327/525; 326/38
(58) Field of Search ................................. 327/525, 143, 327/198; 326/38; 365/225.7

(56) References Cited

U.S. PATENT DOCUMENTS

| | | | | |
|---|---|---|---|---|
| 4,204,131 A | | 5/1980 | Dozier | 327/408 |
| 4,996,672 A | | 2/1991 | Kim | 365/225.7 |
| 5,457,656 A | | 10/1995 | Fu | 365/225.7 |
| 5,461,586 A | | 10/1995 | Nasu | 365/200 |
| 5,579,263 A | | 11/1996 | Teel et al. | 365/189.02 |
| 5,818,275 A | * | 10/1998 | Takahashi et al. | 327/259 |
| 6,094,382 A | | 7/2000 | Choi et al. | 365/230.03 |
| 6,128,234 A | | 10/2000 | Akita et al. | 365/200 |
| 6,188,619 B1 | * | 2/2001 | Jung | 365/200 |
| 6,211,710 B1 | * | 4/2001 | Madhu et al. | 327/198 |

FOREIGN PATENT DOCUMENTS

| | | | |
|---|---|---|---|
| EP | 0 535 776 A1 | 4/1993 | H03K/19/00 |
| EP | 0 855 742 A1 | 7/1998 | H01L/27/118 |
| WO | WO 98/39843 | 9/1998 | H03K/19/177 |

OTHER PUBLICATIONS

"Mixture of Field and Factory Programmed Logic Cells in a Single Device", IBM Technical Disclosure Bulletin, vol. 38, No. 4, Apr. 1, 1995, p. 499, XP002042363.

* cited by examiner

Primary Examiner—Timothy P. Callahan
Assistant Examiner—Terry L. Englund
(74) Attorney, Agent, or Firm—Lisa K. Jorgenson; Stephen Bongini; Fleit, Kain, Gibbons, Gutman & Bongini P.L.

(57) ABSTRACT

A configurable electronic circuit having configuration nodes is provided. Each of the configuration nodes is coupled to corresponding first circuitry that is non-modifiable during configuration and second circuitry that is modifiable during the configuration. The non-modifiable first circuitry selectively imposes one of at least a first potential and a second potential on the configuration node prior to configuration, and the modifiable second circuitry allows modification of the potential imposed on the configuration node by the non-modifiable first circuitry. In a preferred embodiment, the modifiable second circuitry includes at least one fuse that is in an intact state before configuration and that can be changed to a destroyed state after configuration. This enables a reduction in the number of fuses that have to be destroyed during the configuration of the circuit. Also provided is an information processing system that includes at least one configurable electronic circuit having configuration nodes.

20 Claims, 1 Drawing Sheet

CONFIGURABLE ELECTRONIC CIRCUIT

CROSS-REFERENCE TO RELATED APPLICATIONS

This is a continuation of U.S. application Ser. No. 09/468,261, filed Dec. 20, 1999, now U.S. Pat. No. 6,377,111 (issued on Apr. 23, 2002). The entire disclosure of prior application Ser. No. 09/468,261 is herein incorporated by reference.

Additionally, this application is based upon and claims priority from prior French Patent Application No. 98-16367, filed Dec. 23, 1998, the entire disclosure of which is herein incorporated by reference.

BACKGROUND OF THE INVENTION

1. Field of the Invention

The present invention relates to electronic circuits, and more specifically to a configurable electronic circuit whose function can be customized for a specific application.

2. Description of Related Art

While a standard circuit has a function that is defined and completely described in a data book published by the semiconductor manufacturer (i.e., founder), a configurable (or semi-specific) circuit is a circuit whose function can be customized for a specific application. Semi-specific circuits are also distinguishable from specific circuits because specific circuits are obtained by assembling cells that are designed and tested beforehand and use libraries of cells and hardware and software that enable their customization (these are known as pre-characterized circuits). Unlike such pre-characterized circuits, semi-specific circuits are prefabricated and require no additional technological step for customization. This customization may be done by the founder himself or by the final user using simple and low-cost methods.

Thus, for the manufacture of a semi-specific circuit, a distinction must be made between the prefabrication, which alone requires technological steps using appropriate masks, and the customization. The customization of a semi-specific circuit consists of setting up connections so as to impose certain potentials on particular nodes of the circuit (a node being the intersection between two meshes as defined under Kirchoff's laws), especially a ground potential or a supply potential. The value of the supply potential corresponds to the value of a supply voltage that is referenced with respect to the ground. In the following description, the term "configuration" designates the customizing of the circuit and the term "configuration node" designates a node of the circuit on which a specified potential may be imposed through the configuration.

Typically, the configuration is accomplished by the destruction of fuses. A fuse is an essentially capacitive bipolar component having a dielectric that is irretrievably destroyed when a sufficiently high voltage is applied to the terminals of the component. Through this destruction, the component becomes essentially resistive. The voltage required for this destruction is called a disruption or breakdown voltage, and thus the term "breakdown" is also used to designate the destruction of the fuse. However, in the following description and in accordance with the present invention, the term "fuse" is meant to cover all technical equivalents of such a component that can be envisaged by one of ordinary skill in the art. For example, the term "fuse" covers a junction.

The destruction of a fuse requires the generation of a breakdown voltage that is obtained by raising the supply voltage of the circuit, which is generally 3 or 5 volts. The breakdown voltage applied to the terminals of the fuse gives rise to the circulation of a high current between the terminals, and this destroys the fuse at a rate that may be relatively fast or slow. The configuration of an electronic circuit by the disruption or breakdown of the fuse is therefore an operation that entails current consumption and a certain duration. It is advantageous to reduce these two parameters.

SUMMARY OF THE INVENTION

It is an object of the present invention to reduce the time and/or current that is required for destructing fuses during the configuration of a configurable electronic circuit.

Another object of the present invention is to provide a configurable circuit in which a reduced number of fuses have to be destroyed during configuration.

One embodiment of the present invention provides a configurable electronic circuit having configuration nodes. Each of the configuration nodes is coupled to corresponding first means that is non-modifiable during configuration and second means that is modifiable during the configuration. The non-modifiable first means selectively imposes one of at least a first potential and a second potential on the configuration node prior to configuration, and the modifiable second means allows modification of the potential imposed on the configuration node by the non-modifiable first means. In a preferred embodiment, the modifiable second means includes at least one fuse that is in an intact state before configuration and that can be changed to a destroyed state after configuration.

Another embodiment of the present invention provides an information processing system that includes at least one configurable electronic circuit having configuration nodes. Each of the configuration nodes is coupled to corresponding first means that is non-modifiable during configuration and second means that is modifiable during the configuration. The non-modifiable first means selectively imposes one of at least a first potential and a second potential on the configuration node prior to configuration, and the modifiable second means allows modification of the potential imposed on the configuration node by the non-modifiable first means. In one preferred embodiment, the non-modifiable first means includes a sequence of p series-connected inverters, and a connection connecting the configuration node to either the output of the $p^{th}$ inverter or the $q^{th}$ inverter of the sequence, where q is an odd number that is less than p.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
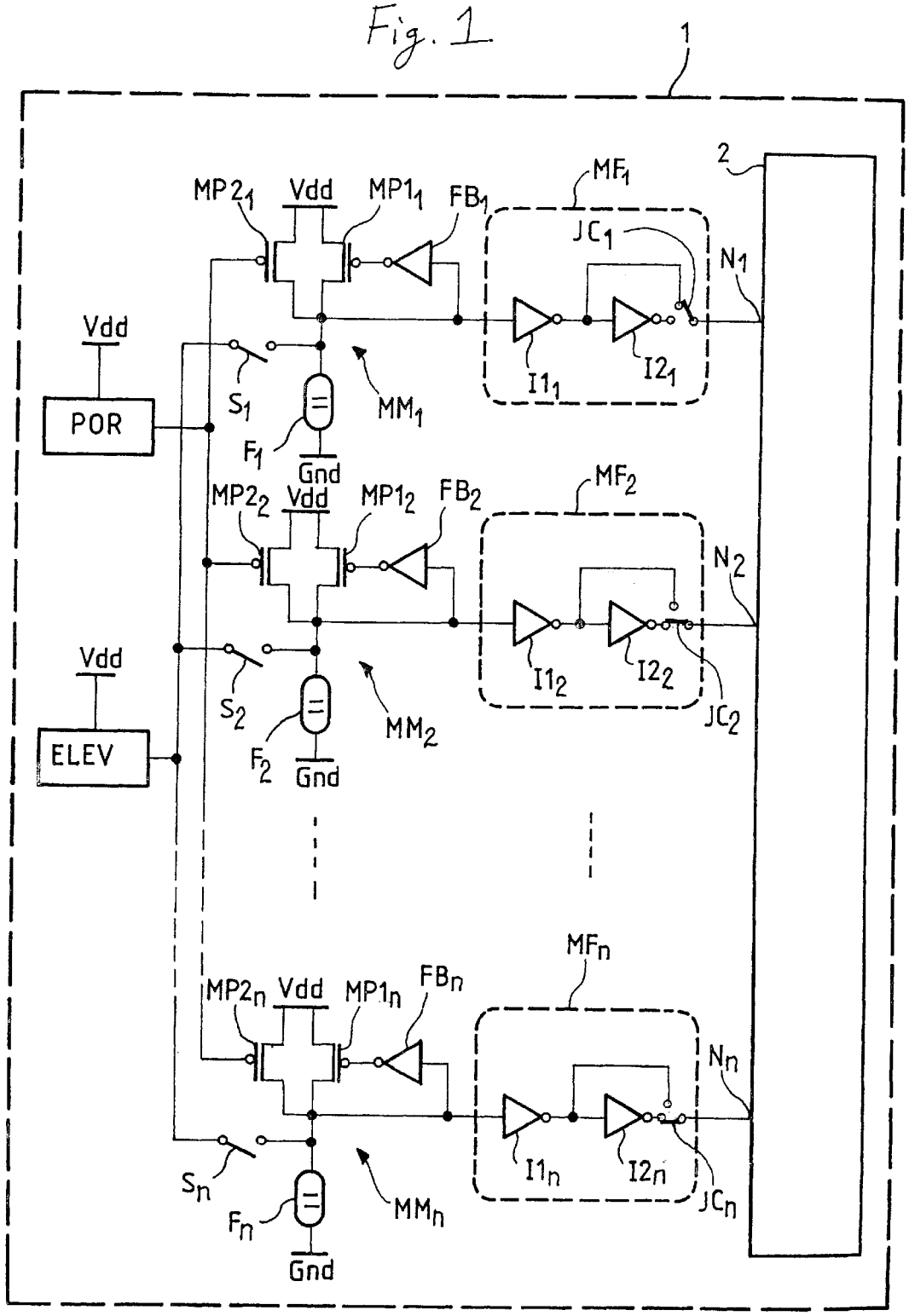
FIG. 1 is a diagram showing a configurable electronic circuit according to a preferred embodiment of the present invention.

Preferred embodiments of the present invention will be described in detail hereinbelow with reference to the attached drawing.

It has been observed that in practice, in most cases of configuration (for example, in 90% of the cases), a specified configuration node must receive the same potential (ground potential or supply potential). However, naturally this potential may be different from the potential that must be received by a neighboring configuration node. In conventional configurable electronic circuits, the default potential imposed on the configuration nodes (before the configuration) is the same for all of the configuration nodes. Thus, assuming that about half of the configuration nodes of the circuit must receive the ground potential and the other half must receive the supply potential (which is an average case), it follows that one in every two fuses must be destroyed during the configuration.

Preferred embodiments of the present invention provide a configurable electronic circuit having configuration nodes, and each configuration node is coupled to corresponding first and second means. The first means, which is non-modifiable during the configuration, selectively imposes one of at least a first potential and a second potential on the configuration node prior to the configuration, and the second means, which is modifiable during the configuration, can be used to modify the potential imposed on the configuration node by the non-modifiable first means.

Thus, for each configuration node, the non-modifiable first means is chosen so as to impose by default (i.e., before configuration) the potential that is statistically most frequently imposed on this configuration node in the various applications of the circuit. As a result, the configuration process does not have to modify the potential imposed by default on a specified configuration node except in 10% of cases (in the case of the example given above). This makes it possible to greatly reduce the number of modifiable second means that must be modified during the configuration. In other words, the number of fuses to be destroyed is greatly reduced.

FIG. 1 shows in detail the relevant portions of a configurable electronic circuit according to a preferred embodiment of the present invention. The remainder of the circuit 1, including the components needed to carry out its function, is symbolized as a single block 2 for simplicity. On the left hand side of this block, the configuration nodes $N_1, N_2, \ldots, N_n$ are schematically separated from the circuit 1 (where n is an integer). As explained above, the configuration consists of imposing a first and second specified potential, generally a ground potential Gnd or a positive supply potential Vdd, on each node $N_1$ to $N_n$. In accordance with the present invention, this is done in two stages by two groups of means.

For each configuration node, the circuit 1 has two types of means. There is a first means that is not modifiable during configuration for selectively imposing on this node either of the potentials Gnd or Vdd before configuration. The second means are modifiable during the configuration for modifying this potential as needed. The non-modifiable first means for node $N_1$ is referenced $MF_1$, for node $N_2$ is referenced $MF_2, \ldots$, and for node $N_n$ is referenced $MF_n$. In the illustrative case in which the first and second potentials are respectively the ground potential Gnd and the positive supply potential Vdd, the first means $MF_i$ (where index i is an integer between 1 and n) includes a sequence of p series-connected inverters, where p is an even number (equal to two in the exemplary embodiment of FIG. 1).

The input of the first inverter $I1_i$ of the sequence receives one of the potentials Gnd or Vdd. For example, the inverters such as $I1_i$ and $I2_i$ can be made using CMOS technology. The first means MFi also includes a connection JCi that connects the configuration node Ni to either the output of the $p^{th}$ inverter of the line or the output of a $q^{th}$ inverter, where q is an odd number smaller than p (in the exemplary embodiment of FIG. 1, q is equal to one). In general, it is sufficient (provided that there are the necessary adaptations as will be seen more clearly below) that p is an even number and that q is an odd number smaller than p.

The connection JCi is made during a metallizing step that is performed during the prefabrication of the circuit. This step is implemented with an appropriate fabrication mask. As a function of this mask, the node Ni is connected to the output of the $p^{th}$ or $q^{th}$ inverter of the sequence. For example, connection $JC_1$, connects node $N_1$ to the output of the first inverter $I1_1$ of first means $MF_1$, while junction $JC_2$ connects node $N_2$ to the output of a second inverter $I2_2$ of first means $MF_2$. The first means $MF_1$ to $MF_n$ are not modifiable during the configuration because configuration occurs after prefabrication. The function of the first means $MF_1$ to $MF_n$ is to selectively impose either of the potentials Gnd or Vdd on the configuration node prior to configuration. The term "selectively" is used to express the fact that the imposed potential is not identical for all the configuration nodes, as shall be explained further below.

The second means that is modifiable during the configuration are referenced $MM_i$ for each configuration node $N_i$, and includes at least one fuse $F_i$. This fuse is in an intact state before configuration. After configuration, the fuse may be in a destroyed state. In other words, the fuse may be destroyed during the configuration. The fuse $F_i$ is laid out so that if a first potential (for example, Vdd) is imposed on the configuration node $N_i$ in the intact state of the fuse, then another potential (for example, Gnd) is imposed on this node in the destroyed state of the fuse (and vice versa).

The modifiable second means $MM_i$ includes the fuse $F_i$ series-connected with a switch-forming means between two terminals that receive the first potential (for example, Gnd) and the second potential (for example, Vdd). The common node between the switch and the fuse is connected to the input of the first inverter $I1_i$ of the sequence of inverters of the non-modifiable first means $MF_i$. In one embodiment, the switch-forming means is quite simply a MOS transistor $MP1_i$ for the second means $MM_i$. Preferably, the drain of this transistor is connected to its control gate through an inverter $FB_i$. This inverter makes it possible to very simply obtain a positive feedback that stabilizes the ON or OFF state of the transistor.

In the exemplary embodiment shown in FIG. 1, the transistor $MP1_i$ is a P-type MOS transistor whose drain is connected to the terminal that receives the first potential (Gnd) through the fuse $F_i$ and whose source is connected to the terminal that receives the second potential (Vdd). However, an equivalent result can easily be obtained with an N-type MOS transistor whose source is connected to the terminal that receives the first potential (Gnd) and whose drain is connected to the terminal that receives the second potential (Vdd) through the fuse $F_i$.

Advantageously, a second P-type MOS transistor $MP2_i$ is parallel-connected to the first transistor $MP1_i$ and, when the circuit is powered on, temporarily receives a voltage delivered by a POR (power-on reset) circuit. This circuit receives the positive supply Vdd. A conventional circuit of this kind delivers a zero voltage (referenced with respect to the ground) for a short transient phase after the powering on of the electronic circuit and then delivers the positive supply voltage (also referenced with respect to the ground) once this voltage is stabilized at its nominal value. The use of the output voltage of the POR circuit to supply certain parts of the electronic circuit makes it possible to overcome problems related to the transient phase of the build-up of the supply voltage of the circuit.

The function of the second transistor $MP2_i$ is to charge the common node between the fuse $F_i$ and the transistor $MP1_i$ to the value of the supply potential Vdd when the circuit is powered on. Thus, if the fuse is intact (equivalent to a capacitor), the node remains charged to the value of Vdd because the transistor $MP1_i$ receives a zero potential at its control gate, which makes it conductive. Conversely, if the fuse is destroyed (equivalent to a resistor), this node will be discharged through the fuse once the supply potential builds up to its nominal value (which furthermore turns $MP2_i$ off). Hence, the potential at the common node falls to ground Gnd so that the first transistor $MP1_i$ receives a supply potential Vdd at its control gate that turns it off, so much so that the potential at the common node is stabilized at ground Gnd.

During the configuration of the circuit, a breakdown voltage is applied to the terminals of only the fuses that have to be destroyed. This breakdown voltage is delivered by a circuit ELEV from the positive supply voltage Vdd. For example, circuit ELEV can be a Schenkel-type multiplier (with diodes and capacitors) or a charge pump circuit. The breakdown voltage is applied to the terminals of the fuses $F_1$ to $F_n$ when necessary through switches $S_1$ to $S_n$, respectively. The switch can be controlled from the exterior of the electronic circuit. Any equivalent means that can be envisaged by one of ordinary skill in the art can alternatively be used.

In the embodiment illustrated in FIG. 1, the first inverter $I1_i$ of the non-modifiable first means $MF_i$ associated with a specified configuration node Ni receives the supply potential Vdd at its input by default (i.e., before configuration). Depending on whether the connection JCi imposes an even or odd number of inverters between the input of the first inverter $I1_i$ of the sequence and the node $N_i$, this sequence then by default receives either the supply potential Vdd or the ground potential Gnd. The configuration makes it possible to modify this potential received by default as needed. In particular, it can be used to make the first inverter $I1_i$ of the non-modifiable first means $MF_i$ no longer receive the supply potential Vdd but instead the ground potential Gnd.

In sum, the manufacture of an electronic circuit according to the present invention is as follows. First, there is a prefabrication through masks used in technological manufacturing steps which, for each group of non-modifiable first means $MF_i$, enable the connection JCi according to either of the possibilities above. Second, there is a configuration that consists of the destruction or non-destruction of the fuse $F_i$ of the modifiable second means $MM_i$ associated with each configuration node $N_i$. This configuration does not include any step of technological manufacture (e.g., it does not consist in modifying the relative implantation of the different silicon-doped zones of the circuit).

The configuration has no effect on the non-modifiable first means $MF_1$ to $MF_n$, even though the purpose and effect can be to modify the potential that the first means imposes by default on the configuration node. In other words, this modification is indirect because it results from the destruction of the fuse of the modifiable second means, which modifies the value of the potential received by the first inverter $I1_i$ of the non-modifiable first means $MF_i$. Further, before configuration, the potential imposed by one of the first means (for example, $MF_2$) on its corresponding node ($N_2$) can be different from the potential imposed by another of the first means (for example, $MF_1$) on its corresponding node ($N_1$). In other words, the first means $MF_1$ to $MF_n$ carry out a pre-configuration or default configuration of the potentials on the configuration nodes $N_1$ to $N_n$, and these potentials are individually determined before the configuration. Thus, it is said that the first means "selectively" imposes one of the potentials.

In preferred embodiments, this individual determining of the potentials at the configuration nodes prior to the configuration is neither arbitrary nor random. On the contrary, for each configuration node, the default configuration of the potential corresponds to the potential that is statistically the most frequent after configuration (i.e., the potential found in the majority of the applications of the configurable circuit). For example, if in a specific case a certain node with a specified configuration $N_i$ receives the ground potential after configuration in 90% of the applications of the circuit, then the non-modifiable first means $MF_i$ associated with this node is made to impose the ground potential and not the supply potential on this node. As a result, the destruction of the fuse $F_i$ is not be necessary in 90% of the applications of the circuit. By individually renewing this determining operation for each configuration node, it is possible to achieve a very significant reduction in the number of fuses that must be destroyed during configuration.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A configurable electronic circuit having a plurality of configuration circuits, each of the configuration circuits comprising:

a configuration node;

first means for selectively imposing one of at least a first potential and a second potential on the configuration node as a default potential prior to configuration, the first means being non-modifiable during the configuration; and second means for allowing modification of the potential imposed on the configuration node by the non-modifiable first means, the second means being modifiable during the configuration, wherein the first means provides the option to have the default potential imposed prior to configuration be not identical for all of the configuration nodes of the configurable electronic circuit.

2. The configurable electronic circuit as defined in claim 1, wherein each of the modifiable second means includes at least one corresponding fuse that is in an intact state before configuration and that can be changed to a destroyed state after configuration, and if one of the first and second potentials is imposed on the corresponding configuration node when the at least one corresponding fuse is in the intact state, then the other of the first and second potentials or a different potential is imposed on the corresponding configuration node when the at least one corresponding fuse is changed to the destroyed state.

3. The configurable electronic circuit as defined in claim 2,
wherein one of the non-modifiable first means includes:
a first sequence of p series-connected inverters, where p is an even number, the input of the first inverter of the first sequence receiving one of the first and second potentials; and
a first connection connecting the corresponding configuration node to the output of the $q^{th}$ inverter of the first sequence, where q is an odd number that is less than p, and
another of the non-modifiable first means includes:
a second sequence of p series-connected inverters, the input of the first inverter of the second sequence receiving one of the first and second potentials; and
a second connection connecting the corresponding configuration node to the output of the $p^{th}$ inverter of the second sequence.

4. The configurable electronic circuit as defined in claim 2, wherein each of the modifiable second means includes a switch-forming means series-connected with the at least one corresponding fuse between two terminals that respectively receive the first potential and the second potential, the common node between the switch-forming means and the at least one corresponding fuse being connected to the input of the corresponding non-modifiable first means.

5. The configurable electronic circuit as defined in claim 4, wherein each of the switch-forming means is a MOS transistor.

6. The configurable electronic circuit as defined in claim 5, wherein each of the MOS transistors has its drain connected to its control gate through a corresponding inverter.

7. The configurable electronic circuit as defined in claim 5, wherein each of the MOS transistors is a P-type MOS transistor whose source is connected to the terminal that receives the first potential and whose drain is connected through the at least one corresponding fuse to the terminal that receives the second potential.

8. The configurable electronic circuit as defined in claim 7, wherein each of the configuration circuits further includes:
a second P-type MOS transistor connected in parallel with the MOS transistor of the corresponding switch-forming means,
wherein when the electronic circuit is powered on, the second MOS transistor receives the output of a power-on reset circuit.

9. The configurable electronic circuit as defined in claim 1, wherein the first potential is a ground potential and the second potential is a positive supply potential.

10. A configurable electronic circuit having a plurality of configuration circuits, each of the configuration circuits comprising:
a configuration node;
first means for selectively imposing one of at least a first potential and a second potential on the configuration node as a default potential prior to configuration, the first means being non-modifiable during the configuration; and
second means for allowing modification of the potential imposed on the configuration node by the non-modifiable first means, the second means being modifiable during the configuration,
wherein one of the non-modifiable first means includes:
a first sequence of p series-connected inverters, where p is an even number, the input of the first inverter of the first sequence receiving one of the first and second potentials; and
a first connection connecting the corresponding configuration node to the output of the $q^{th}$ inverter of the first sequence, where q is an odd number that is less than p, and
another of the non-modifiable first means includes:
a second sequence of p series-connected inverters, the input of the first inverter of the second sequence receiving one of the first and second potentials; and
a second connection connecting the corresponding configuration node to the output of the $p^{th}$ inverter of the second sequence.

11. The configurable electronic circuit as defined in claim 10, wherein one of the modifiable second means includes a switch-forming means series-connected with a fuse between two terminals that receive the first potential and the second potential, the common node between the switch-forming means and the fuse being connected to the input of the first inverter of the first sequence of inverters of the one non-modifiable first means.

12. An information processing system including at least one configurable electronic circuit, the at least one configurable electronic circuit having a plurality of configuration circuits, each of the configuration circuits comprising:
a configuration node;
first means for selectively imposing one of at least a first potential and a second potential on the configuration node as a default potential prior to configuration, the first means being non-modifiable during the configuration; and
second means for allowing modification of the potential imposed on the configuration node by the non-modifiable first means, the second means being modifiable during the configuration,
wherein the first means provides the option to have the default potential imposed prior to configuration be not identical for all of the configuration nodes of the at least one configurable electronic circuit.

13. The information processing system as defined in claim 12,
wherein each of the modifiable second means includes at least one corresponding fuse that is in an intact state before configuration and that can be changed to a destroyed state after configuration, and
if one of the first and second potentials is imposed on the corresponding configuration node when the at least one corresponding fuse is in the intact state, then the other of the first and second potentials or a different potential is imposed on the corresponding configuration node when the at least one corresponding fuse is changed to the destroyed state.

14. The information processing system as defined in claim 13, wherein each of the modifiable second means includes a switch-forming means series-connected with the at least one corresponding fuse between two terminals that respectfully receive the first potential and the second potential, the common node between the switch-forming means and the at least one corresponding fuse being connected to the input of the corresponding non-modifiable first means.

15. The information processing system as defined in claim 14, wherein each of the switch-forming means is a P-type MOS transistor whose source is connected to the terminal that receives the first potential and whose drain is connected through the at least one corresponding fuse to the terminal that receives the second potential, the drain of the P-type MOS transistor being connected to its control gate through a corresponding inverter.

16. The information processing system as defined in claim 15, wherein each of the configuration circuits further includes:
   a second P-type MOS transistor connected in parallel with the MOS transistor of the corresponding switch-forming means,
   wherein when the at least configurable electronic circuit is powered on, the second MOS transistor receives the output of a power-on reset circuit.

17. An information processing system including at least one configurable electronic circuit, the at least one configurable electronic circuit having a plurality of configuration circuits, each of the configuration circuits comprising:
   a configuration node;
   first means for selectively imposing one of at least a first potential and a second potential on the configuration node as a default potential prior to configuration, the first means being non-modifiable during the configuration; and
   second means for allowing modification of the potential imposed on the configuration node by the non-modifiable first means, the second means being modifiable during the configuration,
   wherein one of the non-modifiable first means includes:
      a first sequence of p series-connected inverters, where p is an even number, the input of the first inverter of the first sequence receiving one of the first and second potentials; and
      a first connection connecting the corresponding configuration node to the output of the $q^{th}$ inverter of the first sequence, where q is an odd number that is less than p, and
   another of the non-modifiable first means includes:
      a second sequence of p series-connected inverters, the input of the first inverter of the second sequence receiving one of the first and second potentials; and
      a second connection connecting the corresponding configuration node to the output of the $p^{th}$ inverter of the second sequence.

18. The information processing system as defined in claim 19, wherein one of the modifiable second means includes a switch-forming means series-connected with a fuse between two terminals that receive the first potential and the second potential, the common node between the switch-forming means and the fuse being connected to the input of the first inverter of the first sequence of inverters of the one non-modifiable first means.

19. A configurable electronic circuit having a plurality of configuration circuits, each of the configuration circuits comprising:
   a configuration node;
   first means for selectively imposing one of at least a first potential and a second potential on the configuration node as a default potential prior to configuration, the first means being non-modifiable during the configuration; and
   second means for allowing modification of the potential imposed on the configuration node by the non-modifiable first means, the second means being modifiable during the configuration,
   wherein at least one of the non-modifiable first means includes:
      a sequence of p series-connected inverters; and
      a connection that selectively connects the corresponding configuration node to either the output of the $p^{th}$ inverter of the sequence or the output of a $q^{th}$ inverter of the sequence, where q is less than p.

20. The configurable electronic circuit as defined in claim 19, wherein p is an even number and q is an odd number.

* * * * *